United States Patent [19]
Hanners et al.

[11] Patent Number: 6,040,691
[45] Date of Patent: Mar. 21, 2000

[54] TEST HEAD FOR INTEGRATED CIRCUIT TESTER ARRANGING TESTER COMPONENT CIRCUIT BOARDS ON THREE DIMENSIONS

[75] Inventors: John C. Hanners, Brentwood; Charles A. Miller; Dean Stanford, both of Fremont, all of Calif.

[73] Assignee: Credence Systems Corporation, Fremont, Calif.

[21] Appl. No.: 08/862,596

[22] Filed: May 23, 1997

[51] Int. Cl.⁷ .................................................. G01R 31/02
[52] U.S. Cl. ........................................ 324/158.1; 324/754
[58] Field of Search .............................. 324/158.1, 754, 324/755, 757, 758, 765

[56] References Cited

U.S. PATENT DOCUMENTS

| | | | |
|---|---|---|---|
| 4,517,512 | 5/1985 | Petrich et al. ......................... | 714/724 |
| 4,788,496 | 11/1988 | Maelzer et al. ........................ | 324/754 |
| 4,996,478 | 2/1991 | Pope ...................................... | 324/754 |
| 5,329,226 | 7/1994 | Monnet et al. ........................ | 324/158.1 |
| 5,546,405 | 8/1996 | Golla .................................... | 324/754 |
| 5,747,994 | 5/1998 | Suga ..................................... | 324/158.1 |
| 5,754,057 | 5/1998 | Hama et al. ........................... | 324/754 |

*Primary Examiner*—Josie Ballato
*Assistant Examiner*—Russell M. Kobert
*Attorney, Agent, or Firm*—Smith-Hill and Bedell

[57] ABSTRACT

A test head for an integrated circuit tester includes a horizontal base holding a motherboard. The motherboard distributes test instructions to an array of daughterboards mounted thereon, the daughterboards being radially distributed about a central vertical axis of the motherboard. Each daughterboard holds a set of node cards and includes data paths for forwarding the test instructions from the motherboard to the node cards. Each node card contains circuits for transmitting test signals to and receiving response signals from a separate terminal of a device under test (DUT) in response to the test instructions forwarded thereto. Edges of the daughterboards extend downward through apertures in the base to contact pads on an interface board holding the DUT. The daughterboards provide conductive paths for the test and response signals extending between the node cards and pads on the DUT interface board. The interface board extends those conductive paths from the pads to terminals of the DUT.

35 Claims, 8 Drawing Sheets

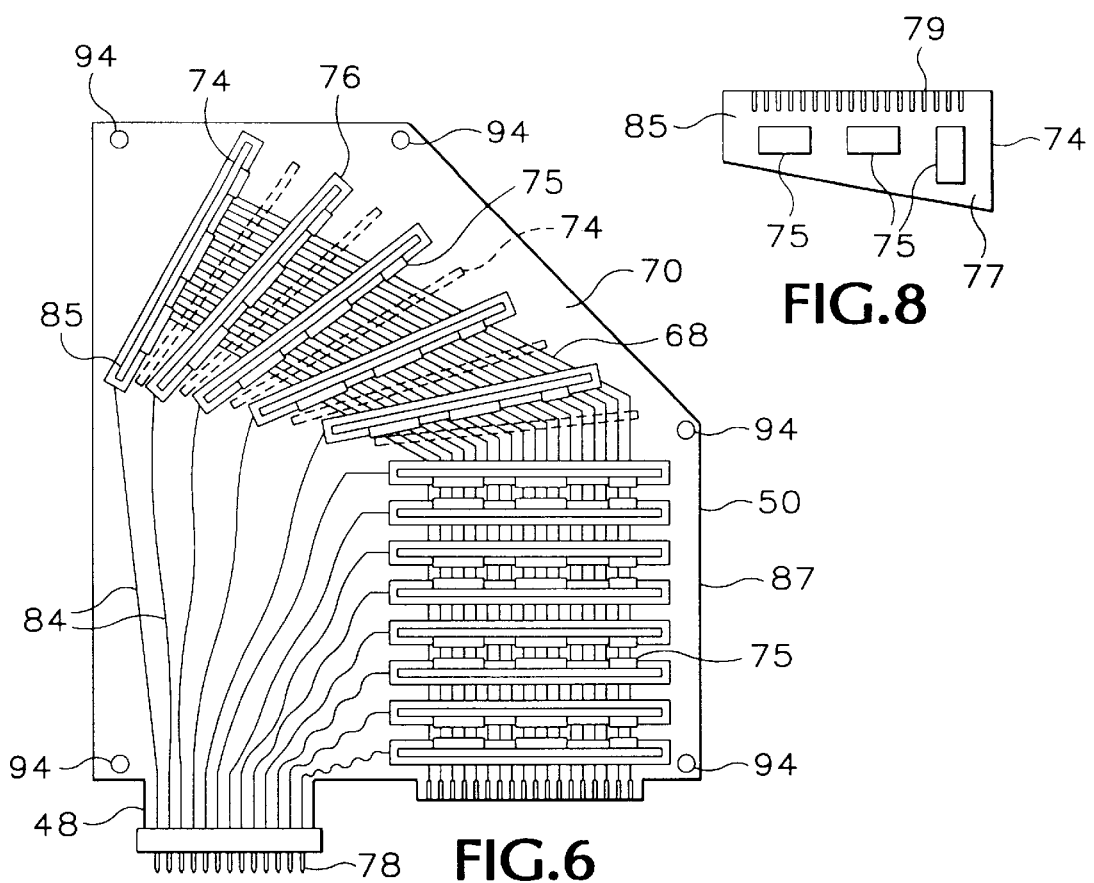
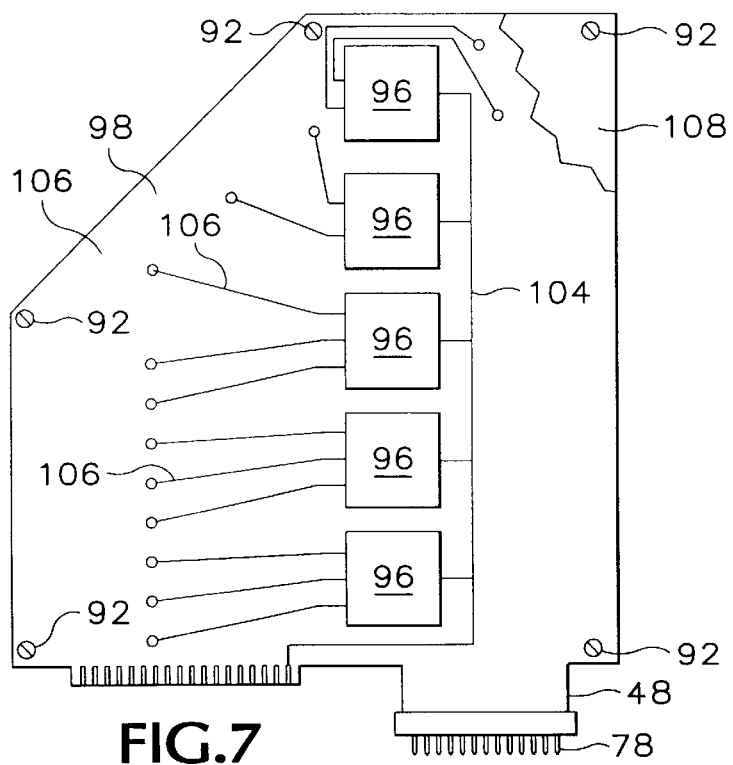

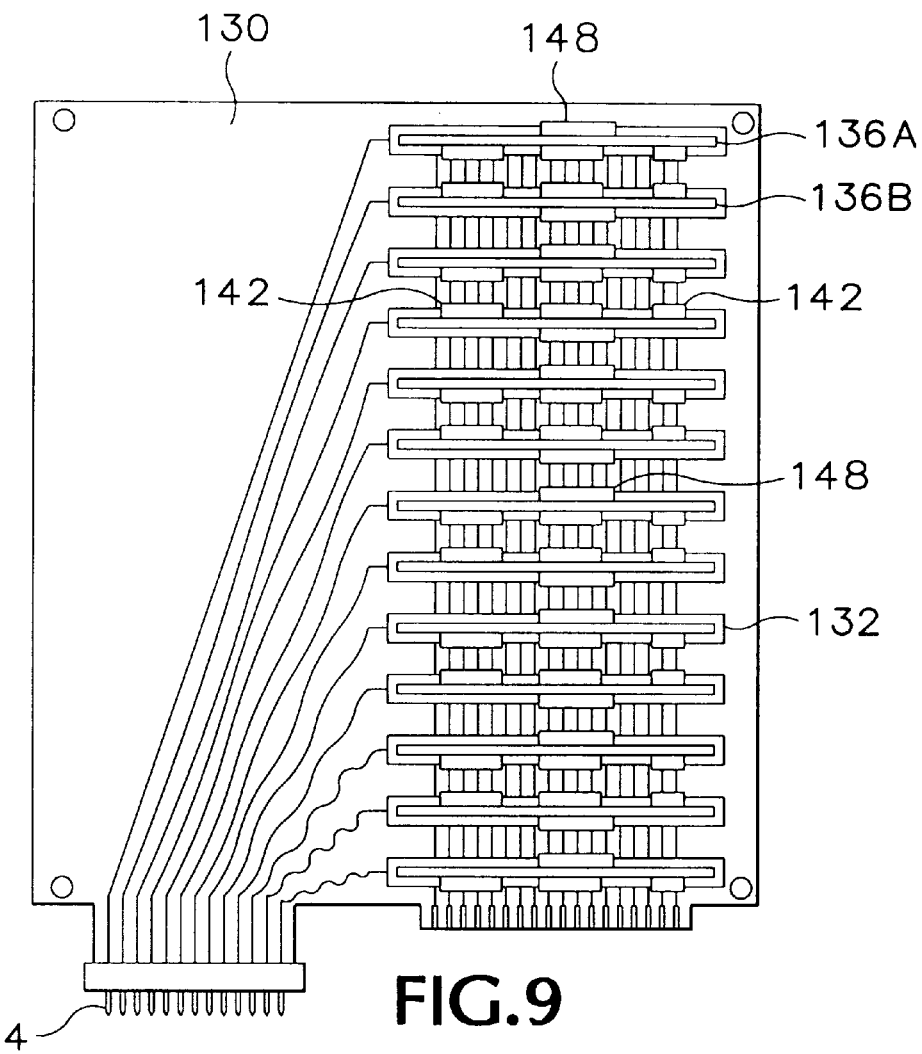
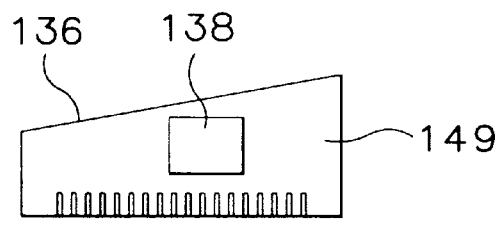
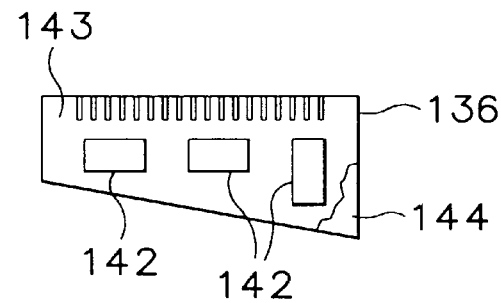

TEST HEAD FOR INTEGRATED CIRCUIT TESTER ARRANGING TESTER COMPONENT CIRCUIT BOARDS ON THREE DIMENSIONS

BACKGROUND OF THE INVENTION

1. Field of the Invention

The present invention relates in general to equipment for automatically testing electronic circuits and in particular to a test head structure for holding components of a per-pin integrated circuit tester.

2. Description of Related Art

An integrated circuit tester applies patterns of logic signals to input terminals of an integrated circuit (IC) and acquires the resulting logic signal patterns produced at its output terminals. Testers typically include a separate "pin electronics" circuit for each IC terminal. During each cycle of a test, a pin electronics circuit can, for example, send a high or low logic level test signal to the pin, sample an IC output signal at the pin and store data indicating its logic level, or do nothing. The action each pin electronics circuit takes during a given test cycle is controlled by the value of input data (a "test vector") supplied thereto at the start of the cycle. A test vector may also include timing data that tells the pin electronics circuit when to carry out the action during the test cycle.

Early IC testers employed a central addressable memory storing a large word at each address, each word being formed by all of the vector data needed for every pin electronics circuit for a particular test cycle. Thus, for example, if an IC had 8 terminals and a tester employed 8-bit vector data words, a 64-bit word was stored at each vector memory address. The vector memory was sequentially addressed so that it read out a next word during each test cycle. The eight vectors contained in the read out word were concurrently distributed to the pin electronics circuits by a large star bus. Thus a vector memory for a test spanning one million test cycles stored one million 64-bit words at successive addresses.

As the size and complexity of IC's increased, so too did the number of terminals on an IC; some IC's now have hundreds of pins. Due to the large number of parallel buses needed to transmit the vectors concurrently to the pin electronics, the use of a centralized vector memory has become impractical. U.S. Pat. No. 4,862,067 issued Aug. 29, 1989 to Brune et al describes a "per pin" integrated circuit tester in which vector storage memory is distributed to the tester nodes. Brune's tester includes a central address generator and a set of tester nodes, one node for each terminal of a device under test (DUT). Each node includes a vector memory for storing a sequence of test vectors, one for each cycle of the test. During a test the central address generator successively increments the address of the test vector memories of all nodes prior to the start of each test cycle so that each test vector memory reads out a new test vector and delivers it to the node's pin electronics at the beginning of each test cycle. In Brune's IC tester, all vector memories are linked to the host computer via a common bus through which the host computer loads vectors into the vector memories before the test. Thus the prior art multiplicity of vector buses leading from a central vector memory to all tester nodes is replaced by a single computer bus linking a host computer to distributed vector memories. While Brune's system reduces the amount of wiring in a tester, it increases the time required to program the tester. Since each vector memory must store one vector for each cycle of the test, the number of vectors that must be distributed to the vector memories can be so enormous that band width limitations on the computer bus greatly limit the speed with which an IC tester can be programmed for a test.

A tester system may reduce the amount of data that must be distributed to the tester nodes by distributing algorithmic instructions for generating vectors instead of the vectors themselves. In such a system, each node includes an instruction processor for generating the vectors during the test based on the locally stored instructions. Integrated circuit testers typically carry out repetitive patterns of actions at various IC terminals at various times during a test. Thus a set of instructions for generating a sequence of vectors including repeating patterns may require less storage space than the sequence of vectors itself. U.S. Pat. No. 4,994,732 issued Feb. 19, 1991 to Jeffery et al describes a per-pin tester which distributes some instruction processing capability to the nodes. In Jeffery's tester, only the first instance of a vector pattern is stored in the vector memory along with a loop instruction indicating the length of the pattern and the number of times a pattern is to be repeated. Each node of a tester includes an instruction processor which sequentially reads vectors out of the vector memory and supplies them to the pin electronics during successive test cycles. When the vector memory controller encounters a loop instruction, it repeats the pattern the indicated number of times. Thus the number of vectors needed to be sent to and stored in a vector memory before a test is reduced.

Signal delay becomes problematic when we employ distributed instruction processors in a large circuit tester. Signal delay is critical when testing an integrated circuit because test activities at all nodes must be precisely coordinated. For example, a test signal sent to an IC input terminal may engender a response in an IC output signal at an IC output terminal. A tester should be able to measure the output signal response at the output terminal at the end of a precisely timed interval following application the test signal to the input terminal. As we increase the complexity of the tester nodes, we also increase the physical size of the nodes and it becomes more difficult to keep all nodes close to the device under test. As the distance between an IC terminal and the tester node that services it increases, so too does the amount of time required for a test or response signal to travel between the IC terminal and the tester node. When testing high speed integrated circuits, this signal travel time becomes a significant portion of the apparent IC response time, thereby complicating tester programming and interpretation of test results.

U.S. Pat. No. 4,517,512 issued May 14, 1985 to Petrich et al describes a test head which holds pin electronics close to the device under tests. In Petrich's test head, a set of circuit cards each containing pin electronics for four IC pins, are arrayed in a radial pattern about a vertical axis of a motherboard. The integrated circuit DUT is mounted on an interface board resting on top of the circular array of pin electronics cards. Test signal input/output terminals at the upper edges of the pin electronics cards connect to the interface board. The interface board delivers test signals from the pin electronics card input/output terminals to the device under test. Petrich's test head is designed to position the pin electronics cards close to the DUT so as to minimize distances between the pin electronics cards and the DUT.

Heat also becomes problematic when we attempt to closely pack distributed instruction processors in a large circuit tester. In Petrich's test head, a duct carries cooling air from a blower to an aperture in the center of the motherboard. The air passes over the pin electronics cards and carries the heat away.

While Petrich's test head brings the pin electronics close to the DUT and keeps the pin electronics cool, the number of pin electronics cards it can accommodate is limited by the allowable diameter of the circular array of pin electronics cards. To increase the number of pin electronics cards, it is necessary to increase the diameter of the circular array, thereby increasing the test signal path distance between the cards and the DUT. One could also increase density by placing pin electronics servicing more than four pins on each pin electronics card. However when pin electronics for only one IC terminal becomes defective, the entire pin electronics card must be replaced, thereby increasing repair costs. Also Petrich's test head does not provide easy access to the pin cards for maintenance and replacement. Finally, when the blower forces air into the test head, that air passes through the head where it is heated and then exits into the room containing the test head. The hot air emanating from the test head can be uncomfortable to operators and maintenance personnel in the vicinity of the test head.

What is needed is a test head structure for holding large numbers of nodes of a per-pin integrated circuit tester close to a device under test while keeping the nodes cool. The test head should provide ready access to pin electronics for maintenance, should cool the nodes without heating the area around the test head, and should require minimal amounts of cabling. The test head should also be highly modular so that system can be sized for the IC being tested and easily expanded.

SUMMARY OF THE INVENTION

A test head for an integrated circuit tester includes a horizontal base holding a motherboard. The motherboard distributes test instructions to an array of daughterboards mounted thereon, the daughterboards being radially distributed about a central vertical axis of the motherboard. Each daughterboard holds a set of node cards and includes data paths for forwarding the test instructions from the motherboard to the node cards. Each node card contains circuits for transmitting test signals to and receiving response signals from a separate terminal of a device under test (DUT) in response to the test instructions forwarded thereto. Edges of the daughterboards extend downward through apertures in the base to contact pads on an interface board holding the DUT. The daughterboards provide conductive paths for the test and response signals extending between the node cards and pads on the DUT interface board. The interface board extends those conductive paths from the pads to terminals of the DUT. The test head includes a perforated outer shell covering the motherboard and daughterboards. As a vacuum pump removes warm air from the shell, cool air enters the shell from the outside through its perforations, thereby cooling the electronics devices mounted on the node cards. The pump exhausts hot air removed from the shell away from the test head.

It is accordingly an object of the test head of the present invention to hold large numbers of nodes of a per-pin integrated circuit tester close to a device under test while keeping the nodes cool. The test head also provides ready access to pin electronics for maintenance, cools the nodes without heating the area around the test head, and requires minimal amounts of cabling. The test head is also highly modular so that system can be sized for the IC being tested and easily expanded.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS(S)

FIG. 1 is an electronic block diagram of a per-pin integrated circuit tester,

FIG. 2 is a pictorial representation of the integrated circuit tester of FIG. 1, FIG. 3 is an exploded perspective view of the test head of the integrated circuit tester of FIG. 2, FIG. 4 is a sectional elevation view of the test head of FIG. 2, FIG. 5 is a partial sectional plan view of the test head test head of FIG. 2, FIG. 6 is an elevation view of a front side of a daughterboard of the test head of FIG. 2, FIG. 7 is an elevation view of a rear side of a daughterboard of the test head of FIG. 2, FIG. 8 is a plan view of an upper surface of a typical node card of the test head of FIG. 2, FIG. 9 is an elevation view of a front side of a first alternative embodiment of a daughterboard for the test head of FIG. 2, FIG. 10 is a plan view of an upper surface of a typical node card for installation in the daughterboard of FIG. 9, FIG. 11 is a plan view of a lower surface of the node card of FIG. 10, FIG. 12 is an elevation view of a pair of daughterboards of the type shown in FIG. 6 showing the spatial relationships between node cards mounted on the daughterboards and a device under test, FIG. 13 is an elevation view of a pair of daughterboards of the type shown in FIG. 9 showing the spatial relationships between node cards mounted on the daughterboards and a device under test, and FIG. 14 is an elevation view of a second alternative embodiment of a daughterboard showing the spatial relationships between node cards mounted on the daughterboard and a device under test when the daughterboard is installed in the test head motherboard of FIG. 2.

DESCRIPTION OF THE PREFERRED EMBODIMENT(S)

Figure 1:
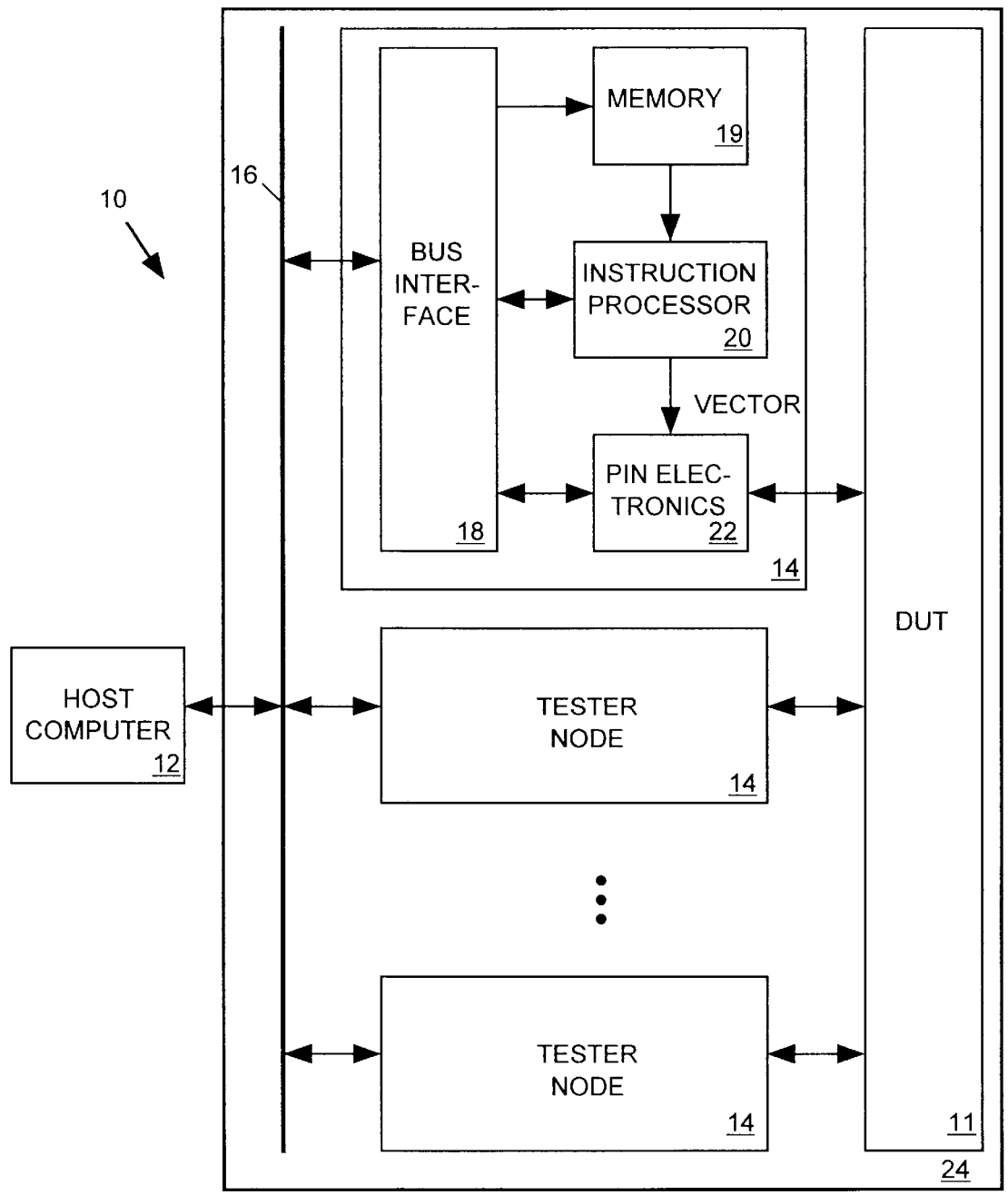

FIG. 1 is an electronic block diagram of a per-pin integrated circuit tester 10 for testing an integrated circuit device under test (DUT) 11. Tester 10 includes a host computer 12 connected to a set of tester nodes 14 via a bus 16. Each tester node 14 includes a bus interface circuit 18, a memory 19, an instruction processor 20, and a pin electronics circuit 22. During a test of DUT 11, the pin electronics circuit 22 of each tester node 14 carries out all test activities with respect to a corresponding terminal of DUT 11. For example at various times during a test, a pin electronics circuit 22 may transmit a test signal of a particular logic level to the DUT terminal or may measure an output signal produced by DUT 11 at the DUT terminal and store data indicating the results in internal acquisition memories. The actions of the pin electronics circuit 22 of each node 14 are controlled by an input sequence of data (test vectors) produced by the node's instruction processor 20 in response to a sequence of instructions it reads out of memory 19. Host computer 12 writes the instructions into the memory 19 of each node 14 before the test via bus 16 and bus interface circuit 18. To initiate the test, host computer 12 sends a start signal to all instruction processors via bus 16 and bus interface circuit 18. During the test, each instruction processor 20 reads instructions out of its local memory 19 and executes the instructions to generate vectors supplied to the local pin electronics circuits 22. After the test, host computer 12 reads acquired test data out of acquisition memories within pin electronics circuits 22, also via bus 16 and bus interface circuit 18.

The design and operation of the electronic aspects of an integrated circuit tester of the type illustrated in FIG. 1 is well-known and not further detailed herein. For example, U.S. Pat. No. 4,994,732 issued Feb. 19, 1991 to Jeffery et al, incorporated herein by reference, describes a similar per-pin integrated circuit tester.

The present invention relates primarily to the mechanical structure of a test head 24 on which tester nodes 14 and DUT 11 are mounted. Test head 24 is designed to hold tester nodes 14 close to DUT 11 so that the signal paths between terminals of DUT 11 and pin electronics circuits 22 of tester nodes 14 are short and of uniform length. A tester should be able to measure the output signal response at the output terminal following a precisely timed interval following application a test signal to the input terminal. When testing high speed integrated circuits, excessive signal travel time between the pin electronics circuit 22 and the DUT 11 can become a significant portion of the apparent IC response time and can complicate tester programming and interpretation of test results. Short signal paths minimize the time required for test signals to travel between pin electronics circuit 22 and terminals of DUT 11. Short signal paths are also less susceptible to noise.

Test head 24 is also designed to keep the electronics in tester nodes 14 cool. Since each tester node 14 includes its own memory 19, instruction processor 20 and other circuits, each node 14 radiates heat. When a large tester 10 includes, for example, 1000 tester nodes 14, each radiating, for example, 5–15 watts, the nodes of test head 24 in total radiate 5,000–15,000 watts. DUT's can also generate substantial amounts of heat. Since tester nodes 14 are clustered as close as possible to DUT 11, a lot of heat is generated in a small space. Various structural features of test head 24 as described herein provide for rapid removal of that heat.

Figure 2:
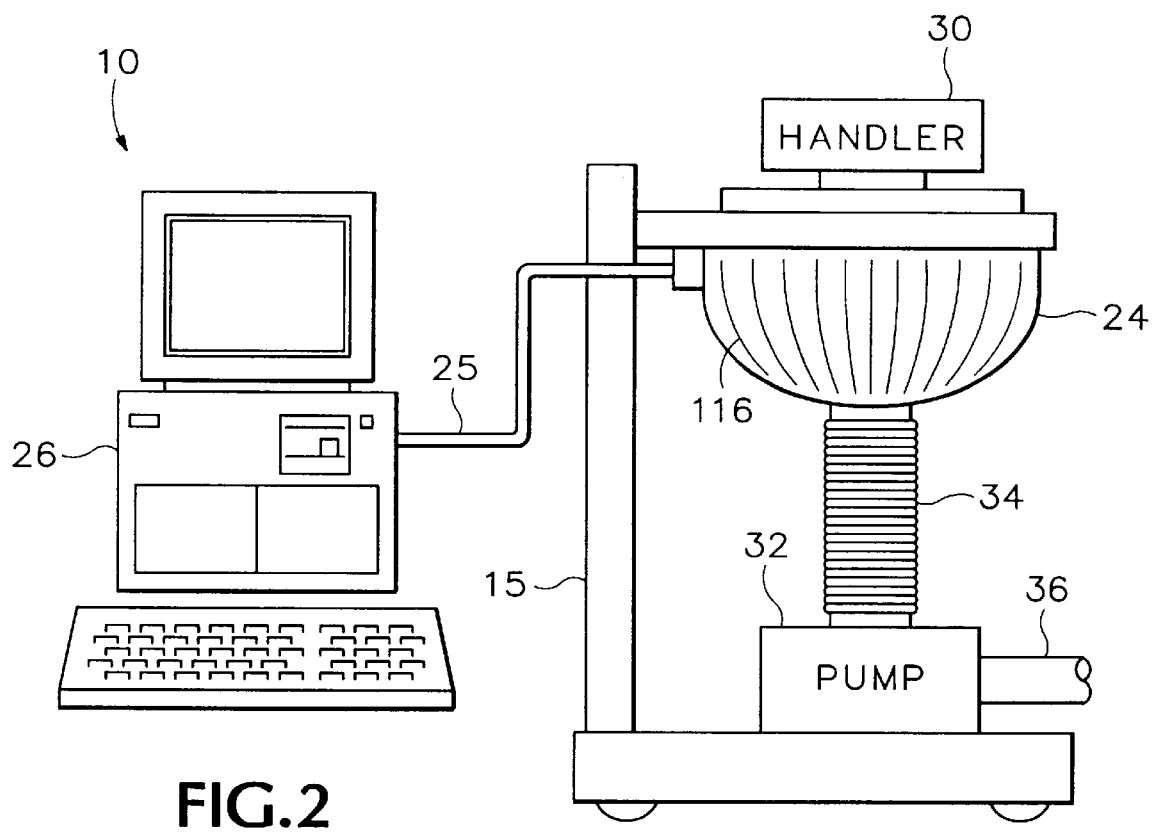

FIG. 2 is a pictorial representation of the integrated circuit tester 10 of FIG. 1. Computer 12, contained in a console 26, is connected to test head 24 via a cable 25 including bus 16 of FIG. 10 and conductors delivering 48-volt power to test head 24 from a power supply within console 26. A conventional manipulator base 28 supports test head 24 in inverted position under an optional DUT handler 30. Handler 30 allows an operator to manipulate DUT 11 of FIG. 2 into position on the underside of test head 24. A vacuum pump 32 connected to test head 24 via a flexible duct 34 draws warm air from test head 24 and exhausts it away from test head 24 via an exhaust pipe 36.

FIGS. 3–8 illustrate the physical structure of test head 24 for integrated circuit tester 10 in accordance with the present invention. Referring to FIGS. 3–8, test head 24 includes a horizontally disposed interface board 40 for holding a device under test (DUT) 11 in a socket (or probe head) 42. A motherboard 44 is mounted on a base plate 46 positioned immediately above and parallel to DUT interface board 40. Lower edges 48 of a set of daughterboards 50 are inserted into connectors 52 mounted on an upper surface 54 of motherboard 44. A cylindrical support member 56, attached to base plate 46 and extending vertically upward from motherboard 44, includes a set of card holders 58 distributed around its outer surface 60 for receiving a front edge 62 of each daughterboard 50. Connectors 52 and holders 58 hold daughterboards 50 in vertical planes perpendicular to the horizontal plane of surface 54 of motherboard 44 with the plane of each daughterboard 50 bisecting the vertical axis 64 of cylindrical support member 56.

A connector 66 attached to base plate 46 and motherboard 44 receives cable 25 of FIG. 2 conveying data bus 16 from host computer 12 of FIGS. 1 and 2. A set of microstrip conductors 69 on the planar upper surface 54 of motherboard 44 extend bus 16 from connector 66 to each daughterboard connector 52. Additional microstrip conductors 68 on the front surface 70 of each daughterboard 50 further extend the data bus onto to each daughterboard. Motherboard 44 is formed by a set of four motherboard sections 44A–44D mounted on base plate 46 and interconnected by connectors 72. Connectors 72 provide path continuity for signals conveyed by microstrip conductors 69 on the surfaces of adjacent motherboard sections 44A–44D.

A set of wedge-shaped node cards 74 are installed in card connectors 76 mounted on a planar front surface 70 of each daughterboard 50. Node cards 74 form a substantially dome-shaped three-dimensional array about vertical axis 64. Integrated circuit devices 75 implementing the various components of each tester node 14 of FIG. 1 are mounted on a surface 77 of each node card 74. The microstrip conductors 68 on the front surface of each daughterboard 50 deliver bus 13 of FIG. 1 to each node card connector 76. Each connector 76 connects the bus to terminals 79 of the node card 74 mounted therein. Microstrip conductors (not shown) on the front surface 77 of the node card 74 deliver the bus to one of integrated circuits 75 mounted thereon.

A set of pogo pins 78 attached to an extension 79 of the lower edge 48 of each daughterboard 50 extend downward through an aperture 80 in base plate 46 to contact conductive pads 82 on an upper surface 83 of DUT interface board 40. Microstrip conductors 84 on front surface 70 of each daughterboard 50 provide test signal paths between the pogo pins 78 attached to the lower edge 48 of the daughterboard 50 and node card connectors 76. Conductors 86 on the lower surface 88 of DUT interface board 40 and vias 87 passing through interface board 40 extend the test signal paths from pads 82 to the socket (or probe head) 42 on the underside of DUT interface board 40 containing DUT 11. The socket (or probe head) 42 extends the test signal paths to terminals of DUT 11. Thus a test signal produced by an integrated circuit 75 implementing the pin electronics circuit 22 (FIG. 1) and mounted on a surface 77 of a node card 74, passes from that integrated circuit, through a connector 76 to a conductor 84 on the front surface 70 of the daughterboard 50 on which the node card 74 is installed. The test signal then passes through the conductor 84 to one of pogo pins 78, through the pogo pin 78 to a pad 82 on upper surface 83 of DUT interface board 40, and through a via 87 and a trace 86 on the lower surface 88 of DUT interface board 40 to a terminal of socket 42. A DUT 11 output signal follows the same path in the opposite direction from socket 42 back to the integrated circuit 75 on the node card 74.

To minimize the maximum distance between pogo pins 78 and test signal input/output terminals at narrow ends 85 of the uppermost node cards 74, the uppermost node cards 74 are positioned closer to support member 56 and tilted so that their narrow ends 85 point downward toward motherboard 44. Thus planes formed by surfaces of uppermost cards 74 bisect the horizontal plane of motherboard surface 54. The lengths of signal traces 84 and 86 on the daughter boards 50 and device interface board 40 are adjusted as necessary so that the total length of the test signal path between each node card 74 and the DUT 11 terminal it accesses is standardized.

Daughterboards 50 appear in two versions. The front surfaces 70 of "left-handed" daughterboards 50A are on the left as we view them from their rear edges, the edges most distant from radial axis 64. FIGS. 6 and 7 illustrate front and rear views of a left-handed board. The front surfaces 70 of "right-handed" daughterboards 50B are on the right as we view them from their rear edges. Right-handed boards are substantially, but not entirely, mirror images of the left-handed boards shown in FIGS. 6 and 7. Right-handed and left-handed daughterboards 50A and 50B are installed on motherboard 44 in an alternating fashion so that the node cards 74 of each left-handed daughterboard 50A face node cards 74 of an adjacent right-handed daughterboard 50B. Uppermost node cards 74 of adjacent daughterboards 50A and 50B interleave to provide these node cards with sufficient space between the daughterboards. Each adjacent pair of right-handed and left-handed daughterboards 50A/50B are attached by screws 92 to opposite ends of a set of threaded rods 94, structural members affixed to and extending between opposing corners of the daughterboard pair. Rods 94 act as spacers to horizontally stabilize the daughterboards. A daughterboard pair 50A/50B may be removed by pulling it upward from its connectors 52 on motherboard 44, sliding it upward through its holders 58. A node card 74 can be installed on or replaced in either daughterboard 50A or 50B by first removing screws 92 and pulling the two daughterboards 50A and 50B apart.

A set of DC-DC power conversion circuits 96 are mounted on the back surface 98 of each daughterboard 50. Power conversion circuits 96 convert a 48-volt input power signal to lower voltage output power signals supplying circuit devices mounted on node cards 74. A connector 100 mounted on an edge of base plate 46 and attached to motherboard 44 receives the 48-volt power source from console 26 of FIG. 2 via cable 25 and delivers it to a microstrip conductor 102 on the upper side of motherboard 44. Microstrip conductor 102 delivers the 48-volt power signal to each daughterboard connector 52. A microstrip conductor 104 on the back side 98 of each daughterboard 50 conveys the 48-volt power signal from connector 52 to power conversion circuits 96. Additional microstrip conductors 106 on back surface 98 of daughterboards 50 convey the lower voltage output power signals produced by conversion circuits 96 to node card connectors 76, which deliver the power signals to node cards 74 mounted therein. Each daughterboard 50 includes a ground plane layer 108 between its front surface 70 and its back surface 98. The ground plane layer 108 shields the node cards 74 installed in connectors 76 on the front surface 70 of daughterboard 50 from noise generated by power conversion circuits 96 mounted on the back surface 98 of the daughterboard 50.

Test head 24 includes a perforated outer shell 110 covering motherboard 44 and daughterboards 50. Shell 110 includes a flange 112 screwed to base plate 46. Shell 110 is suitably constructed of conductive metal to provide an electromagnetic interference shield. Cylindrical support member 56 extends upward through a port 114 of shell 110. Vacuum pump 32 of FIG. 2, connected to support member 56 via flexible duct 34 and clamp 113, pumps warm air out of the interior of cylindrical support member 56. Cool air enters the test head through slots 116 in shell 110 and passes between node cards 74 to remove heat generated by integrated circuit devices 75 and power conversion circuitry 96 mounted thereon. The heated air then enters cylindrical support member 56 though slots 118 to be evacuated by vacuum pump 32. Cooling can be augmented by placing test head 24 in a refrigerated room or in a larger container (not shown) into which refrigerated air is forced. The heated air pumped out of test head 24 is suitably exhausted from the room containing test head 24. Test head 24 may be alternatively cooled by pumping air into, rather than out of, support member 56. However since the hot air would exit from slots 116 in shell 110 and heat the area surrounding test head 24, pumping air out of support member 56 is preferable.

On front surface 77 of wedge-shaped node cards 74 are mounted the various integrated circuits 75 implementing bus interface 18, memory 19, instruction processor 20, pin electronics circuit 22 and other devices of node 14 of FIG. 1. A ground plane (not shown) covers a back surface of each node card 74. Terminals 79 along one edge of each node card 74 mate with its card connector 76 to deliver signals to integrated circuits 75. The integrated circuits 75 of each node card 74, when mounted on daughterboard 50, are substantially surrounded by node card and daughterboard ground planes which shield the integrated circuits 75 from electromagnetic noise produced by the power conversion circuits and from noise sources external to test head 24.

The modular architecture of test head 24 allows it to operate with less than all of its full complement of components. Not every node card connector 76 need hold a node card 74 and not every daughterboard connector 52 need hold a daughterboard 50. It is not necessary that all daughterboards 50 contain the same number of node cards 74. Also test head 24 will operate without a full complement of motherboard 44 sections 44A–44D. Thus test head 24 can be matched in capacity to the number of terminals of devices to be tested and can be easily expanded in capacity as need dictates by adding motherboard sections, daughterboards and node cards.

The capacity of test head 24 can be further increased by increasing tester node density on node cards 74 without having to replace other components of test head 24. A sufficient number of conductors 84 may be included on the surface of daughterboards 50, for example, to route eight test signals between each node card 74 and pogo pins 78 so that each node card connector 76 may accept node cards 74 implementing from one to eight tester nodes. Thus when each node card of test head 24 initially implements one tester node, only one in eight of the test signal conductors 84 and one in eight pogo pins 78 are used. The remaining seven test signal conductors and pogo pins 78 are spare. The capacity of that test head 24 could later be increased by replacing one or more of the node cards 74 with higher density node cards implementing two or more tester nodes, thereby making use of the spare test signal conductors 84 and pogo pins 78. It is not necessary that all node cards 74 in test head 24 have the same tester node density.

Figure 3:
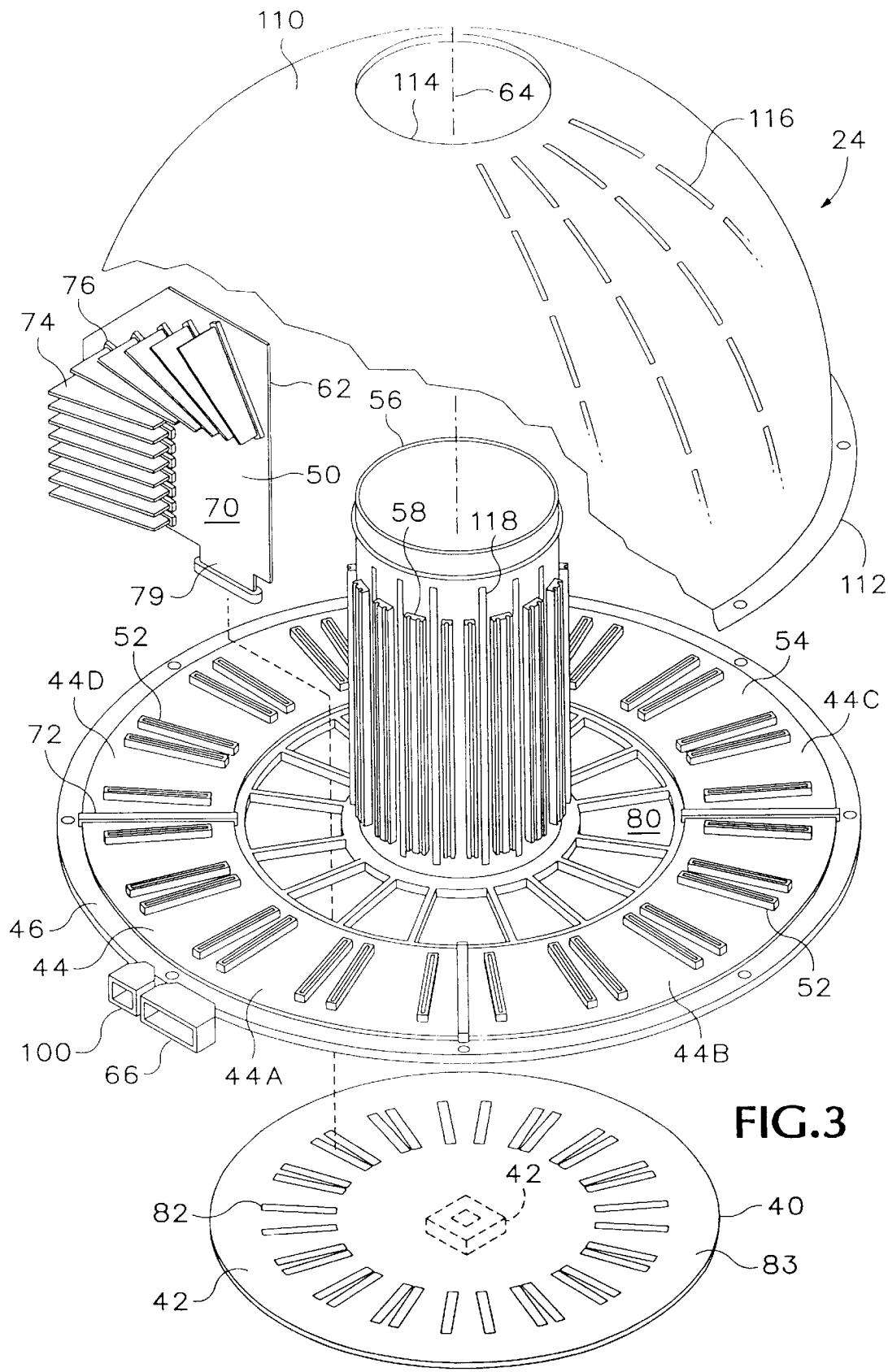
Figure 4:
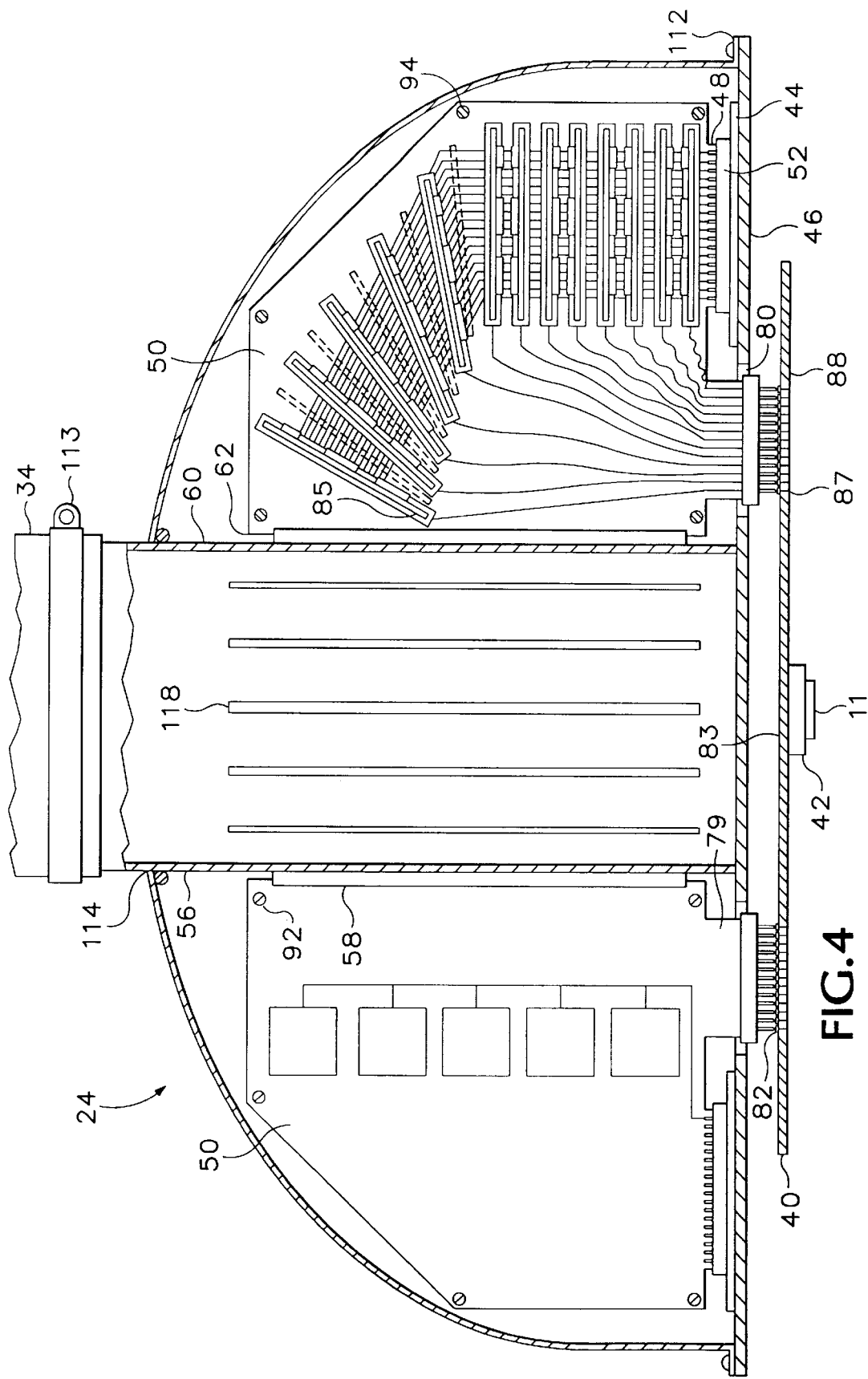
Figure 5:
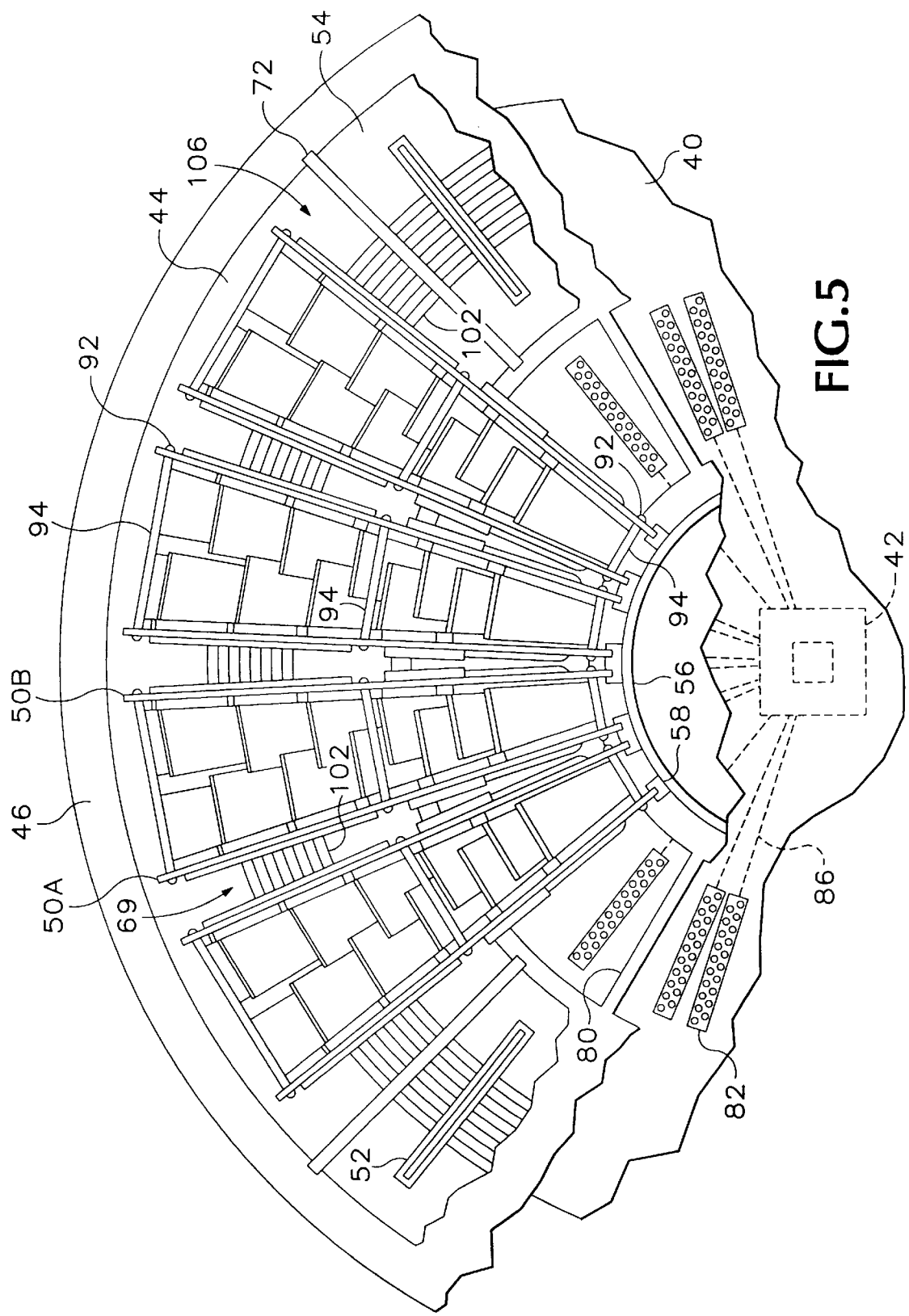

FIG. 9 is a plan view of an alternative embodiment of a daughterboard 130 for test head 24 of FIG. 3. This embodiment is somewhat similar to the daughterboard of FIG. 6 except that the node card connectors 132 are vertically stacked on daughterboard 130 rather than arrayed in the crescent-shaped pattern of node card connectors 76 of daughterboard 50 of FIG. 6. Thus node cards 136 when installed in connectors 132 form a substantially cylindrical-shaped array about axis 64. While daughterboard 50 of FIG. 6 minimizes signal path distances between the uppermost node card connectors 76 and pogo pins 78, daughterboard 130 can be easily lengthened in the vertical direction (with corresponding vertical lengthening of outer shell 110 of FIG.

2) so that it can contain more node cards than daughterboard 50 of FIG. 6. The number of node cards that may be installed in daughterboard 130 is limited only by the maximum allowable distance of the test signal path between pogo pins 134 and the uppermost node card connector 132.

FIGS. 10 and 11 are front and rear plan views of a node card 136 suitable for installation in daughterboard 130 of FIG. 9. Daughterboard 130 of FIG. 9 also differs from daughterboard 50 of FIG. 6 in that no power conversion circuits are mounted on its back side. Instead a power conversion circuit 138 is mounted on a back side of each node card 136 installed on daughterboard 130. However daughterboard 130 includes 48-volt power distribution conductors (not shown) on its rear surface to distribute the 48 volt power supply signal to all node cards 136. A set of integrated circuits 142 implementing tester node electronics are mounted on the front surface 143 of each node card 136. A power conversion circuit 148 is mounted on the back surface 149 of each node card 136. A ground plane layer 144 is sandwiched between the front and back sides 143 and 149 of the node card 136. Adjacent pairs of node cards 136A and 136B mounted in daughterboard 130 have mirror image layouts so that integrated circuits 142 of adjacent cards 136A and 136B face one another. Thus integrated circuits 142 of adjacent node cards 136A and 136B are substantially surrounded by ground plane layers 144 within the node cards 136A and 136B to shield them from noise emanating from power conversion circuits 148 and external sources.

Figure 12:
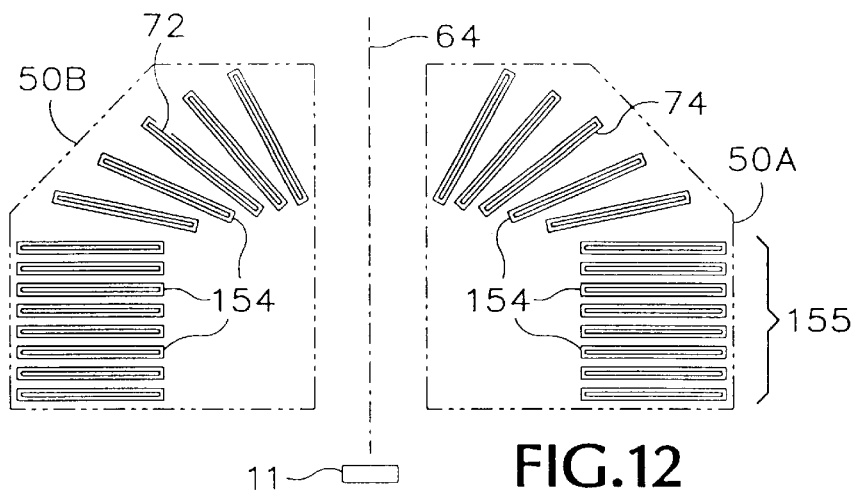

FIG. 12 is an elevation view of a pair of daughterboards 50A/50B of the type shown in FIG. 6. With node cards 50 installed in a circular pattern about axis 64, the node card test signal input/output terminals 154 through which the node cards communicate with the device under test 11 are distributed along a dome-shaped surface in three-dimensional space about axis 64 at varying distances above DUT 11. While terminals 154 on one or two daughterboards 50 may lie in a single plane, when more than two daughterboards 50 are installed in the motherboard, there is no single plane containing the input/output terminals 154 of all node cards 74. While the terminals 154 of a subset 155 of node cards 74 nearest DUT 11 are equidistant from axis 64, for terminals 154 of the uppermost node cards 74, the distance of between a terminal 154 and axis 64 is a function of the terminal's distance from DUT 11. The uppermost node cards are moved closer to axis 64 so as to reduce the signal path distance between their terminals and DUT 11.

Figure 13:
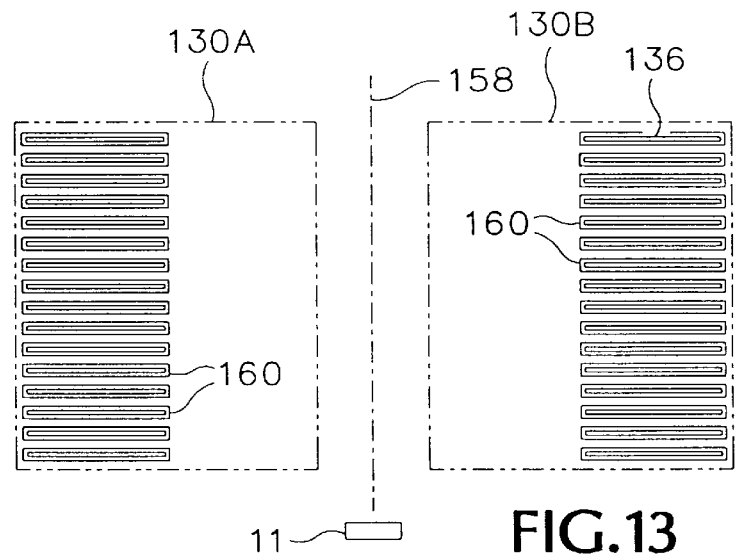

FIG. 13 is an elevation view of a pair of daughterboards 130A/130B of the type shown in FIG. 9. With daughterboards 136 installed in motherboard 44 of FIG. 3 instead of daughterboards 70, node card 136 are distributed radially about axis 64. In particular, test signal input/output terminals at node card front edges 160 through which the node cards communicate with the device under test 11 are distributed along a cylindrical surface in three-dimensional space about test head axis 64 at varying distances above DUT 11. In this arrangement, input/output terminals at front edges 160 of all node cards 136 are held such they are equidistant from axis 158. The spatial distribution of node cards shown in FIG. 13 is suitable when a tester is to employ a large number of node cards and signal distance is not a limiting factor.

Figure 14:
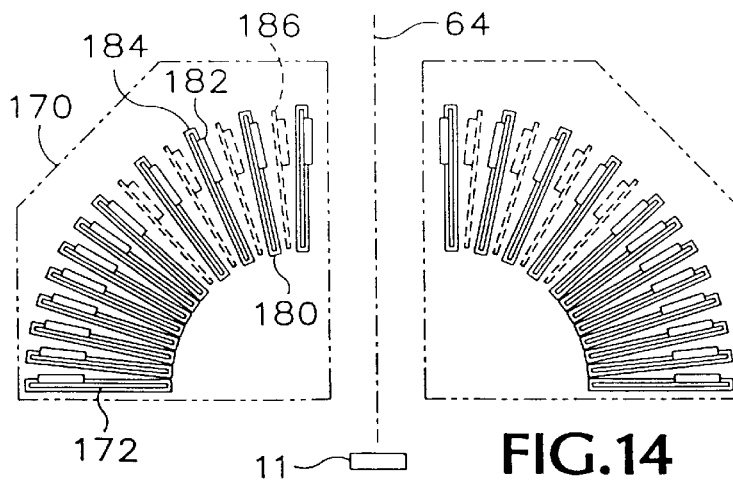

The maximum signal distance between any node card and the DUT can be reduced by mounting node cards on each daughterboard so that their front edges are substantially equidistant from the DUT when the daughterboards are mounted on the motherboard. FIG. 14 is an elevation view of the front sides of a pair of daughterboards 170, each a second alternative daughterboard embodiment which may be inserted into the motherboard 44 of FIG. 3 instead of daughterboards 70. FIG. 14 illustrates the spatial relationship between daughterboards 70, device under test 11, and the test head axis 64. When mounted in the motherboard daughterboard 170 distributes node cards 172 radially about DUT 11 so that test signal input/output terminals at the front edges 180 of all node cards 172 are substantially equidistant from DUT 11. The thickest integrated circuit devices 182 implementing the node's electronics are mounted nearest the rear edges 184 of the node cards 172 where adjacent node cards are most widely spaced. The uppermost node cards 172 are spaced so as to interleave with node cards 186 of an adjacent daughterboard (not shown). This particular arrangement of node cards 172 on daughterboard 170 is useful when it is necessary to keep signal path distances to a minimum for a given number of nodes.

It should be understood from the foregoing examples, that by adjusting the manner in which node cards are distributed on the daughter cards, it is possible to adjust the three-dimensional spatial distribution of the node cards with respect to the device under test to provide a suitable compromise between maximum test signal path lengths and number of node cards.

Thus has been described a test head structure for holding large numbers of nodes of a per-pin integrated circuit tester close to a device under test while keeping the nodes cool. The test head provides ready access to pin electronics for maintenance, cools the nodes without heating the area around the test head and requires minimal cabling. The test head is also highly modular so that the system can be sized to the IC being tested and easily expanded.

While the forgoing specification has described preferred embodiment(s) of the present invention, one skilled in the art may make many modifications to the preferred embodiment without departing from the invention in its broader aspects. For example, as illustrated embodiment of test head 24, the device interface board 40 may hold a single packaged integrated circuit DUT 11 in a socket 42. It should be understood, however, that device interface board 40 may be customized for each type of device to be tested. For example, device interface board 40 may have several IC sockets 42 for containing several IC devices so that they may be tested concurrently. Such multiple sockets may also be interconnected via traces on the upper surface 83 of device interface board 40 so that several IC's mounted therein may be tested as an interactive circuit. For testing unpackaged ICs, device interface board 40 may include a conventional probe head manipulated by handler 30 of FIG. 2 for contacting pads on the surface of an IC.

The appended claims therefore are intended to cover all such modifications as fall within the true scope and spirit of the invention.

What is claimed is:

1. A test head for an electronic circuit tester of the type having a plurality of tester nodes, each tester node communicating with a device under test (DUT) during a test via a separate test signal, the test head comprising:

a plurality of node cards, each having a first planar surface holding at least one of said tester nodes;

a plurality of daughterboards, each having connectors on a second planar surface holding a plurality of said node cards;

a DUT interface board for holding said DUT, said DUT interface board having a third planar surface containing a plurality of contact pads and having means for conveying test signals between said DUT and said contact pads; and means for holding said daughterboards such that each daughterboard contacts a separate subset of said contact pads and such that their second planar surfaces lie in separate planes intersecting at a single common axis perpendicular to said third planar surface of said DUT interface board.

2. The test head in accordance with claim 1 wherein each daughterboard includes means for conveying test signals between the contact pads it contacts and the node cards it holds.

3. The test head in accordance with claim 1 wherein the second planar surface of each daughterboard holds the first planar surface of at least one of said node cards parallel to said third planar surface of said DUT interface board.

4. The test head in accordance with claim 3 wherein each daughterboard also holds the first planar surface of at least one other of said node cards other than parallel to said third planar surface of said DUT interface board.

5. The test head in accordance with claim 1 wherein said node cards form a three-dimensional array.

6. The test head in accordance with claim 1 wherein said means for holding holds each daughterboard such that its second planar surface is perpendicular to said third planar surface of said DUT interface board.

7. The test head in accordance with claim 1 wherein said node cards each have a narrow end positioned nearest said vertical axis and a wider end positioned farthest from said vertical axis.

8. The test head in accordance with claim 1 wherein said means for holding holds said daughterboards such that their second planar surfaces lie in planes perpendicular to said third planar surface of said DUT interface board, each of said planes intersecting and such that said second planar surfaces form a substantially circular array about said axis.

9. The test head in accordance with claim 8 wherein the second planar surfaces of adjacent pairs of said daughter boards substantially face one another.

10. The test head in accordance with claim 9 wherein at least a portion of the node cards held by a first daughterboard of an adjacent pair of said daughterboards are spatially interleaved with node cards held by a second daughterboard of said adjacent pair.

11. The test head in accordance with claim 8 including structural members affixed to and extending between adjacent pairs of said daughterboards.

12. The test head in accordance with claim 1 wherein said means for holding said daughterboards such that each daughterboard contacts a separate subset of said contact pads, comprises:
   a base plate having parallel fourth and fifth planar surfaces, said third planar surface of said DUT interface board being adjacent to said fourth planar surface, said base plate having at least one aperture extending through said fourth and fifth planar surfaces; and
   a motherboard mounted on said fifth planar surface of said base plate and containing connectors for holding said daughterboards,
   wherein a portion of each daughterboard, when held by one of said connectors, extends through said at least one aperture in said base plate and contacts said subset of said contact pads.

13. The test head in accordance with claim 12 further comprising:
   a support member having an outer surface and extending from said fifth planar surface of said base plate, and
   a plurality of card holders mounted on said outer surface of said support member for receiving and holding said daughterboards.

14. The test head in accordance with claim 13 wherein said support member is substantially cylindrical in shape.

15. The test head in accordance with claim 13 further comprising:
   an air pump, and
   means for attaching said air pump to said support member such that said air pump pumps air from an interior of said support member.

16. The test head in accordance with claim 15 wherein said outer surface of said support member is slotted such that when said air pump pumps air from the interior of said support member, air enters said interior through the slotted surface.

17. The test head in accordance with claim 16 further comprising a slotted cover attached to said base plate and covering said daughterboards.

18. A test head for an electronic circuit tester of the type having a plurality of tester nodes, each tester node communicating with a device under test (DUT) during a test via a separate test signal in response to an input set of instructions, the test head comprising:
   a plurality of node cards, each having a first planar surface holding at least one of said tester nodes;
   a plurality of daughterboards, each having a second planar surface holding a plurality of said node cards;
   a DUT interface board for holding said DUT, said DUT interface board having a third planar surface containing a plurality of contact pads and having means for conveying test signals between said DUT and said contact pads; and
   a base plate having parallel fourth and fifth planar surfaces, said third planar surface of said DUT interface board being adjacent to said fourth planar surface, said base plate having at least one aperture extending through said fourth and fifth planar surfaces; and
   a motherboard mounted on said fifth planar surface of said base plate, said motherboard holding said daughterboards, wherein a portion of each daughterboard extends through said at least one aperture in said base plate and contacts ones of said contact pads, and wherein said motherboard includes means for receiving said input instructions and distributing them to said daughterboards, and wherein each daughterboard includes means for receiving said input instructions from said motherboard and for distributing them to the node cards it holds.

19. The test head in accordance with claim 18 wherein said motherboard comprises:
   a plurality of motherboard sections mounted on said base plate, and
   a plurality of motherboard connectors linking said motherboard sections, said connectors conveying said input instructions between said motherboard sections.

20. The test head in accordance with claim 18 further comprising a set of power conversion circuits each for producing at least one output power signal in response to an input power signal,
   wherein the input and output power signals have differing voltage levels, each daughterboard holding at least one of said power conversion circuits, and
   wherein each daughterboard includes means for conveying said at least one output power signal to the node cards mounted thereon.

21. The test head in accordance with claim 20
   wherein said motherboard includes means for delivering said input power signal to each of said daughterboards,
   wherein each of said daughterboards includes means for delivering said input power signal from said motherboard to the power conversion circuit mounted thereon.

22. The test head in accordance with claim 18 wherein each daughterboard includes a back planar surface parallel to said second planar surface for holding at least one of said power conversion circuits and includes a ground plane between said second planar surface and said back planar surface.

23. A test head for an integrated circuit tester, for responding to input instructions by testing an integrated circuit device under test (DUT) having a plurality of terminals, the apparatus comprising:

a horizontal base plate having a plurality of apertures distributed about a vertical axis;

an interface board positioned below said base plate for holding said DUT and having a plurality of conductors below said apertures for contacting said terminals of said DUT;

a plurality of node cards each containing a tester node for transmitting and receiving test signals in response to the test instructions supplied as input thereto;

a substantially planar motherboard mounted above said base plate; and a plurality of substantially planar daughterboards mounted on said motherboard in vertical planes radially arrayed about said central vertical axis, each daughterboard holding a separate subset of said node cards, each daughterboard having an edge extending downward through one of said apertures in said base and contacting one of said conductors on said interface, the daughterboards including conductive paths for the test signals extending between the node cards and said conductors on the DUT interface board.

24. The test head in accordance with claim 23 wherein the motherboard includes means for receiving said input test instructions and distributing them to said daughterboards, and wherein said daughterboards include means for forwarding the test instructions from the motherboard to the node cards.

25. The test head in accordance with claim 23 wherein each of said node cards comprises:

a first surface;

a second surface parallel to said first surface;

a ground plane between said first and second surfaces;

said tester node mounted on said first surface; and a power conversion circuit mounted on said second surface for producing at least one output power signal for said tester node in response to an input power signal, wherein the input power signal and the output power signal have differing voltage levels.

26. The test head in accordance with claim 23 wherein adjacent pairs of daughterboards hold their node cards therebetween.

27. The test head in accordance with claim 26 further comprising structure members affixed to and extending between adjacent pairs of daughterboards.

28. The test head in accordance with claim 23 wherein said node cards each have a narrow end positioned nearest said vertical axis and a wider end positioned farthest from said vertical axis.

29. A test head for an integrated circuit tester, the integrated circuit tester being of the type having a plurality of tester nodes, each tester node comprising an electronic circuit for communicating with a separate terminal of an integrated circuit device under test (DUT) while the tester is testing the DUT, the test head comprising:

a motherboard disposed in a horizontal plane and having a plurality of apertures therein;

a DUT interface board for holding said DUT, the DUT interface having a surface held in a horizontal plane below said motherboard, a plurality of contact pads distributed on said surface below said apertures, and means for conveying signals between said contact pads and terminals of said DUT, a plurality of node cards, each containing at least one of said tester nodes;

a plurality of daughterboards, held on said motherboard in vertical planes radially disposed about a vertical axis passing through the motherboard, each daughterboard holding a plurality of said node cards, each daughterboard including conductive means, each extending through one of said apertures in said motherboard and contacting a separate contact pad of said DUT interface board for conveying a signal from said contact pad to one of said node cards.

30. The test head in accordance with claim 29 wherein said node cards are arranged on said daughterboards such that some of said plurality of node cards are substantially above others of said plurality of node cards.

31. The test head in accordance with claim 29 wherein said conductive means comprises a pogo pin assembly mounted on a lower edge of said daughterboard.

32. The test head in accordance with claim 29 further comprising:

a cylindrical support member having an interior and having a slotted surface extending upward from said motherboard about said vertical axis, a plurality of card connectors mounted on said outer surface of said cylindrical support member for receiving and holding said daughterboards, an air pump, and means for attaching said air pump to said cylindrical support member such that said air pump pumps air from an interior of said cylindrical support member and such that air enters said interior through the slotted surface.

33. The test head in accordance with claim 32 further comprising a slotted cover surrounding said daughterboards.

34. The test head in accordance with claim 29 wherein each of said node cards comprises:

said node electronics;

a first surface for holding said node electronics;

a second surface for holding power conversion circuits for producing at least one output power signal in response to an input power signal, wherein the input power signal and the output power signal have differing voltage levels;

a ground plane between and substantially coextensive with said first an second surfaces;

means for delivering said output power signal to said node electronics, wherein said node cards are oriented on said daughterboards such that the first surface of each node card substantially faces the first surface of a first adjacent node card, if any, and the second surface of each node card substantially faces the second surface of a second adjacent node card, if any, and wherein said daughterboards include opposing front and back surfaces, the node card connectors being mounted on said front surface and a ground plane covering said second surface.

35. The test head in accordance with claim 34 wherein said node cards have a narrow end positioned nearest said vertical axis and a wide end positioned farthest from said vertical axis.

* * * * *